United States Patent [19]

Korjukin et al.

[11] 4,148,939
[45] Apr. 10, 1979

[54] METHOD OF MANUFACTURING A TRANSPARENT BODY HAVING A PREDETERMINED OPACITY GRADIENT

[76] Inventors: Alexandr V. Korjukin, Chernomorsky bulvar, 4, kv. 249; Galina S. Vesnitskaya, Pervomaiskaya ulitsa, 109/2, kv. 14; Elena M. Gerasimova, Izmailovksy prospekt, 119, kv. 2; Matvei M. Gudimov, ploschad Vosstaniya, 1, kv. 419; Emma F. Markina, ulitsa B. Zhigulenkova, 1/20, kv. 19, all of Moscow; Alexandr A. Klitsov, ulitsa Karantinnaya, 86; Alexandr T. Kovtun, Krasnogvardeisky pereulok, 13, kv. 5, both of Taganrog Rostovskoi oblasti; Georgy M. Beriev, Simferopolsky bulvar, 27, kv. 36, Moscow; Viktor L. Vasilchenko, ulitsa Prokhladnaya, 3, kv. 17, Taganrog Rostovskoi oblasti, all of U.S.S.R.

[21] Appl. No.: 498,614

[22] Filed: Aug. 19, 1974

[51] Int. Cl.² .............................................. B05D 5/06
[52] U.S. Cl. .................................... 427/164; 427/165; 427/166; 427/248 R; 427/255
[58] Field of Search ................... 117/106 R, 211, 333; 427/164, 165, 166, 255, 248 R; 350/314

[56] References Cited

U.S. PATENT DOCUMENTS

| 2,676,114 | 4/1954 | Barkley | 427/166 |
|---|---|---|---|
| 3,004,875 | 10/1961 | Lytle | 427/110 |
| 3,034,924 | 5/1962 | Kraus | 427/166 |
| 3,113,040 | 12/1963 | Winston | 117/211 |
| 3,189,481 | 6/1965 | Gaynor et al. | 117/211 |
| 3,203,836 | 8/1965 | Gaynor et al. | 117/211 |
| 3,531,335 | 9/1970 | Heyedahl et al. | 117/201 |
| 3,661,636 | 5/1972 | Green et al. | 117/201 |
| 3,692,572 | 9/1972 | Strehlow | 117/35 R |

Primary Examiner—Michael F. Esposito
Attorney, Agent, or Firm—Steinberg and Blake

[57] ABSTRACT

A method of manufacturing a transparent body, such as a pane of a window, which has a predetermined opacity gradient. A light filtering substance is evaporated in an evacuated atmosphere upwardly from an evaporator to deposit itself upon a surface which is situated over and directed toward this evaporator, the latter surface forming part of a transparent body and the light filtering substance providing for the transparent body an opacity or optical density which increases as the thickness of the deposit of the light-filtering substance on the latter surface increases. The transparent body is maintained stationary in the evacuated atmosphere over the above evaporator during deposition of the evaporated substance onto the body surface which is directed toward the latter location. A predetermined relationship is maintained between the above surface of the transparent body and the evaporator from which the light filtering substance is evaporated, this relationship being predetermined in accordance with at least one of two factors, namely the factor of the distance between points of the above surface and the evaporator and the factor of the angle of evaporation of the evaporator.

9 Claims, 2 Drawing Figures

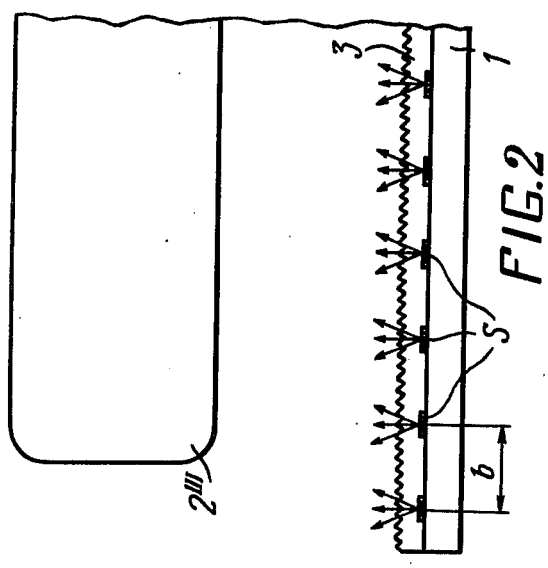
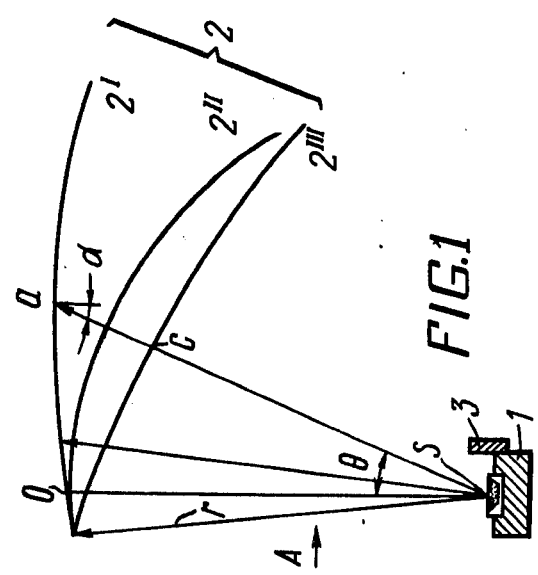

METHOD OF MANUFACTURING A TRANSPARENT BODY HAVING A PREDETERMINED OPACITY GRADIENT

BACKGROUND OF THE INVENTION

The present invention relates to the manufacture of transparent bodies to be used in the windows of land, sea, or air vehicles.

In particular, the present invention relates to the manufacture of such transparent bodies with predetermined optical density or opacity gradients.

Thus, the present invention relates to the art of manufacturing light filters by applying to the surface of a transparent substrate or body a light filtering coating in the form of a light filtering substance which is deposited on the substrate or body by thermal evaporation in an evacuated atmosphere. The invention relates particularly to the method of providing such light filters with a varying optical density.

Thus, the method of the present invention may be employed in the manufacture of light-filtering glass panes or panels to be used in the windows or portholes of vehicles which are designed to travel on the ground or to be water-borne or air-borne.

While of course such transparent bodies having predetermined optical density gradients are well-known, the known methods of thermally evaporating in an evacuated atmosphere depositions which will form coatings of varying thickness to achieve the optical density gradient suffer from serious drawbacks. It is customary with conventional methods to emply various types of baffles, shutters, masking members, or the like, which are moved in a predetermined manner during the deposition of the coating on the surface of the transparent body, or with subsequent selective oxidation of the deposited coating being achieved by way of an electrical discharge. Thus, these known techniques require situating in the evacuated chamber where the deposition of the coating takes place movable structures which undesirably complicate the method of manufacture while increasing the cost thereof considerably.

SUMMARY OF THE INVENTION

It is accordingly a primary object of the present invention to provide a manufacturing method of the above general type which avoids the above drawbacks.

Thus, it is an object of the present invention to provide a manufacturing method of the above general type which is relatively simple and inexpensive, particularly as compared to the above known techniques.

Thus, it is an object of the present invention to provide a method of manufacturing a transparent body which has a predetermined optical density gradient in such a way that there is no requirement of situating in the evacuated atmosphere where the deposition takes place structures which must be moved in a predetermined manner.

In other words, it is an object of the present invention to provide a method of manufacturing a transparent body which has a predetermined optical density gradient while maintaining the transparent body stationary with respect to the location from which the light filtering medium is evaporated and without utilizing any movable components in the evacuated chamber.

In accordance with the present invention there is deposited on the surface of a transparent body a light filtering medium or substance which will provide the transparent body on which it is deposited with an optical density which increases as the thickness of the deposited coating increases. The light filtering medium is evaporated in an evacuated atmosphere upwardly from an evaporator. A transparent body is situated in the evacuated atmosphere with a surface of the body situated over the evaporator so that the evaporated substance deposits itself on the above surface of the transparent body. A predetermined relationship between the surface which receives the deposit and the evaporator is maintained during deposition, and this relationship is predetermined in accordance with at least one of two factors, namely, the factor of the distance between points on the surface of the body and the evaporator and the factor of the angle of evaporation.

BRIEF DESCRIPTION OF DRAWINGS

The invention is illustrated by way of example in the accompanying drawings which form part of this application and in which:

FIG. 1 is a schematic representation of different methods according to the invention, with part of the evaporating structure being shown in section in FIG. 1; and FIG. 2 is a fragmentary elevation of the arrangement of FIG. 1 as seen in the direction of the arrow A of FIG. 1.

DESCRIPTION OF PREFERRED EMBODIMENTS

When evaporating a light filtering coating upwardly onto a downwardly directed surface of a transparent body which is situated over the evaporator, the thickness of the deposited light filtering coating may be calculatd from the following formula:

$$\delta = M/\pi\gamma \cdot \cos\theta \cdot \cos\alpha / r^2 \text{ (cm), where}$$

M is the quantity of the evaporated substance in grams, $\gamma$ is the density or specific gravity of the light filtering substance in grams/cm$^3$, $\theta$ is the angle between the direction of travel of the upwardly moving molecular stream resulting from evaporation and a line normal to the surface of the evaporator or a vertical plane which includes a horizontal line along which evaporators for the substance to be evaporated are located, this angle being the evaporation angle of the evaporator in radians, $\alpha$ is the angle between the direction of the upwardly traveling molecular stream, resulting from evaporation, and the surface of the substrate or body which receives the deposited substance, or in other words the angle between the latter molecular stream and a line normal to a tangent to the latter surface where the molecular stream engages the latter surface, in radians, and r is the distance from the evaporator to the substrate or surface of the body which receives the deposition, in cm.

For a given light filtering substance which is evaporated the specific gravity or density $\gamma$ is constant. The quantity M of the evaporated substance is selected so as to provide the desired maximum value of the optical density of the light filter at a particular area of the surface which receives the deposit. The angle $\alpha$ should advantageously always be maintained as close to zero as possible since otherwise there may occur the so-called anisotropy of oblique angle, resulting in a poor structure of the coating. However, even if in some cases this angle α is not equal to zero, its value is not an independent variable inasmuch as this angle α is defined by the values of θ and r.

Thus, it is clear that the thickness gradient of the deposited coating and thus the optical density gradient thereof, is determined by two factors, namely, the value of r and the angle θ.

Referring to FIG. 1, the arrangement illustrated therein is situated in an evacuated chamber the structure of which is not illustrated. This structure of FIG. 1 which is situated in the vacuum chamber includes, for the purpose of performing the method of making light filters of varying optical density in accordance with the present invention, an elongaged evaporation strip or support member 1 having the evaporator elements S secured thereon. These evaporating elements S may be of any known construction, either of the point type or of the band type. Thus, the point type of evaporator is a droplet of the substance being evaporated while the band type of evaporator is a boat, and the latter type of evaporators can be arranged either with their longitudinal axes extending parallel to the plane of FIG. 1, transversely with respect to the elongated support 1, or the boats may be arranged along a common straight line parallel to the elongated strip or base 1 which carries the boats. In any event, the evaporation of the light filtering substance is considered as taking place upwardly from a straight horizontal line normal to the plane of FIG. 1 and situated at the elevation of the upper surface of the evaporating elements S, so that this line from which various distances are measured, as referred to below, is the line at which the several inclined lines of FIG. 1 intersect at the top surface of the elements S.

Thus, it will be seen from FIG. 1, that within the evacuated vacuum chamber there is secured in any suitable manner at a distance r from the evaporation strip 1, this distance being measured as described above, a stationary substrate or transparent body 2. FIG. 1 illustrates three possible situations for the transparent substrate or body 2 which has a downwardly directed surface which receives the deposit resulting from the evaporation. Thus, at the uppermost part of FIG. 1 there is shown one type of substrate or body 2' having over the evaporator structure a downwardly directed concave surface as illustrated. Instead of this body 2' it is possible to evaporate the light filtering substance onto the downwarly directed concave surface of a body 2" which has a downwardly directed surface forming part of a cylinder of constant radius equal to the distance r, so that in this case the axis of the cylindrical surface which receives the deposit and the line normal to FIG. 1 from which evaporation takes place coincide. In addition, FIG. 1 illustrates a further example where a substrate or transparent body 2''' is illustrated. This latter type of body or substrate may be identical with the body or substrate 2" but is positioned at a different inclination, as illustrated in FIG. 1.

The strip or support 1 fixedly carries along its right vertical surface, as viewed in FIG. 1, an elongated screen 3 which extends upwardly beyond the evaporator elements S. This screen 3, which has an upper edge of substantially sawtooth configuration, as shown in FIG. 2, serves to define on the surface of the substrate or body 2 which receives the deposit an area of predetermined minimum optical density.

The evaporation angle θ is defined as an angle between the evaporating direction such as that indicated by the line Sa of the molecular stream evaporating upwardly from the evaporator S and a vertical plane which contains the horizontal line along which the evaporators are located, this vertical plane being shown at SO in FIG. 1.

Various points along the surface of the substrate which receives the deposit and which are located in the plane of FIG. 1 will have different evaporating angles depending upon the distance of these points from the plane SO.

The angle α is defined as the angle between the evaporating direction Sa of the upwardly traveling molecular stream and a line normal to the surface which receives the deposit, this particular angle being shown for the evaporating line Sa at the downwardly directed surface of the body 2' in FIG. 1. Thus it will be seen that the angle α is defined between the direction of travel of the molecular stream of evaporated light filtering substance and a line which is perpendicular to a tangent to the curved surface at the point which receives the light filtering substance.

The substrate or transparent body 2 is secured inside the evacuated vacuum chamber of the deposition apparatus so that the coating of light filtering substance may be deposited by the method of thermal evaporation in a vacuum with the substrate or body having a predetermined specific position with respect to the evaporators S (or with respect to a system of such evaporators). The initial data for predetermining the construction of the evaporator S and the position of the substrate 2 relative to the evaporator S are the dimensions of the substrate and the desired maximum value of the optical density of the light filter, as well as the desired gradient of this optical density. The transparent body or substrate 2 is positioned with respect to the evaporator S in accordance with the proportion $Cos\theta/r^2$, calculated for the area of the substrate where the value of the optical density is to be a maximum so as to be greater than the latter proportion or ratio as calculated for any other area of the substrate or transparent body 2.

The optical density of a light filtering coating is directly proportional to its thickness. The optical density of a light filter is equal to the sum of the values of the optical density of the coating and of the substrate. For practical purposes, this optical density may be considered as directly proportional to the thickness of the deposited coating inasmuch as the optical density of the substrate or transparent body is practically negligible.

FIG. 2 of the drawings illustrates the arrangement of FIG. 1 as seen in the direction of the arrow A. Thus, part of the elongated evaporating strip 1 is illustrated with the several evaporating elements S uniformly spaced therealong. It will be seen that the successive evaporators S are situated at a distance b from each other.

In accordance with one embodiment of a method of the present invention, the desired gradient of the thickness of the light filtering coating is obtained only by varying the distance r. Thus, according to this embodiment of the present invention the factor of the evaporating angle θ has no influence. This embodiment of the invention has proved to be very convenient in those cases where the evaporators S are of the point type, for example, in the form of a droplet of the substance being evaporated. Thus the variation of the angle $\theta$ will not influence the intensity of the molecular stream.

However, in accordance with other embodiments of the method of the invention, the desired gradient of the thickness of the light filtering coating is achieved either by varying only the evaporation angle $\theta$, in which case the distance factor r is maintained constant, or by varying the values of both the angle $\theta$ and the distance r. The most suitable embodiment in any practical case will be determined by the desired value of the gradient of the optical density of the light filter.

The above-described methods of the invention may be illustrated by several practical examples as follows:

EXAMPLE 1

Among the practical applications of the method of the present invention is the manufacture of light filtering porthole glass panels for passenger airplanes. Thus, it is customary to protect the passengers in a passenger airplane from the glare of the sun by utilizing suitable sunshades in the form of movable shutters or blinds. These structures, however, undesirably affect the interior appearance of the airplane and undesirably increase the weight thereof. By utilizing light filtering porthole glass panels having a varying optical density, it is possible to eliminate such shutters or blinds. The optical density of the porthole panels should vary from a maximum value at the top of the panel to a minimum value at the bottom thereof.

In the present example the substrate or transparent body 2' illustrated in FIG. 1 is a panel of oriented organic glass having a thickness of 1.5 mm. Thus, the organic glass has its crystals oriented in a particular manner. In this particular example the length of the panel is 600 mm and its height is 400 mm. The maximum deflection of the panel is 20 mm. In other words this latter deflection is the extent to which the panel deviates from a flat panel.

The light filtering substance evaporated onto the downwardly directed concave surface of this panel in this example is cuprous sulfide ($Cu_2S$). This particular substance is in the nature of a semiconductor, so that it will not have a metallic reflecting capability. In this way the possibility of mirror-like reflection within the passenger space of the airplane at the top of the porthole glass is avoided. The evaporator structure includes the strip 1 described above and shown in the drawings having thereon at the spacing b of 100 mm from each other seven tungsten band-type evaporators or boats S, each of which is 10 mm wide by 20 mm long. Each of these boats is supplied with 0.25 grams of cuprous sulfide to be thermally evaporated.

The substrate of body 2' is positioned so that it extends parallel to the strip 1 at a distance r equalling 300 mm from the evaporator to the area of the substrate surface which receives the deposit and this latter area corresponds to the top part of the porthole glass panel.

Over this latter area which will be the top part of the panel as well as over the rest of the areas along the glass panel there is deposited a coating which, as a result of the superpositioning of the molecular evaporating streams flowing upwardly from the evaporators S, may for practical purposes be considered as of uniform thickness in the longitudinal direction of the panel. Thus it has been found from experience that in those cases where the ratio b/r is not in excess of 0.3–0.4, any non-uniformity of the thickness of the coating considered longitudinally, in a direction parallel to the strip 1, cannot be visually detected in the form of varying transparency of the coating.

In the direction from the top toward the bottom of the panel, which is to say in a direction across the panel (i.e. in the direction Oa in FIG. 1), the thickness of the coating gradually diminishes as a result of the increasing distance r and increasing angle $\theta$ in a clockwise direction from the vertical plane SO, as viewed in FIG. 1. The position of the screen 3 mounted on the right lateral edge of the strip 1, as viewed in FIG. 1, defines the width of the area of the substrate 2' which will have the minimum optical density.

As a result of the evaporation of the above quantity of cuprous sulfide with the above-described geometric relationship of the evaporators S with respect to the substrate 2', there is deposited on the downwardly directed concave surface of the substrate, which is maintained stationary during the entire deposition, a coating the thickness of which gradually varies from zero (or, to be more precise from 5–10 nm) to 240 nm (nanometers). Accordingly, the transparency of the porthole panel varies from 90% down to 5%, while its optical density varies from 0.05 to 1.3.

EXAMPLE 2

In order to attain a gradient or reduction of the optical density of the porthole panel which is not as sharp as that of Example 1 above, the same substrate 2' which has been referred to above in Example 1 is changed so as to be curved to a greater extent. Thus, the substrate 2' described above is replaced by a substrate 2" of the same material but having the curvature illustrated in FIG. 1 according to which the surface which receives the deposit forms part of a cylinder of constant radius r. In other words the axis of the downwardly directed concave surface of the substrate or transparent body 2" coincides with the straight line normal to the plane of FIG. 1 from which the light filtering substance evaporates upwardly. Thus, in this particular example the surface which receives the deposit of light filtering substance is equidistant from the evaporators S, and therefore the thickness of the light filtering coating diminishes exclusively as a result of the increasing angle $\theta$, in a clockwise direction, as viewed in FIG. 1.

EXAMPLE 3

In this example the very same substrate 2' described above in Example 1 has its position changed so that is occupies the location 2''' in FIG. 1. Thus the distance r from the evaporator to the surface of the substrate diminishes in the clockwise direction OC, whereas this distance increased in Example 1. In this case, however, the diminishing of the thickness of the coating as a result of the increasing angle $\theta$, in the clockwise direction as viewed in FIG. 1, is somewhat compensated by the gradual reduction in the distance r in the same direction, from the surface of the substrate to the evaporator, and as a result of this compensation the gradient of the optical density is relatively small.

EXAMPLE 4

In this case the substrate is located, as shown in FIG. 1, either in the position 2' or in the position 2''', and a point evaporator, or a system of point evaporators, forms the evaporator in this example. In this case the thickness of the light-filtering coating either decreases when the substrate has the position 2' or increases when the substrate has the position 2''' in the direction Oa as a result of the variation of only the factor r.

In addition to the above specific examples, it is to be noted that light filtering materials other than those referred to above may be used. For example it is well known that different iron oxide mixtures are suitable for the light filtering substances which are deposited by evaporation in the evacuated atmosphere on the surface of the transparent body or substrate. In order to avoid undesired reflection with such substances the iron oxide mixtures are given a brownish color.

However, the method of the invention is applicable to substrates or bodies having configurations different from those shown in FIG. 1 and referred to specifically above. Thus part of the surface which receives the deposit may extend vertically or substantially vertically, substantially parallel to the plane SO.

What is claimed is:

1. In a method of manufacturing a transparent body which has at least in part an optical density which gradually changes in degree in a given direction, the steps of evaporating in an evacuated atmosphere upwardly from an evaporator a light filtering substance of a type which when deposited on a surface of a transparent body forms thereon a coating which will increase the optical density of the body as the thickness of the deposited coating increases, simultaneously positioning in said evacuated atmosphere over said evaporator a transparent body which has a surface directed toward said evaporator to receive the evaporated light filtering substance which deposits itself on said surface, to form said coating thereon, maintaining the body stationary during deposition of said substance on said surface thereof, and providing between said surface of said body and said evaporator a relationship which is predetermined in accordance with two factors, namely the factor of the distance between points of said surface and said evaporator and the factor of the angle of evaporation of the evaporator with respect to said points, while also arranging said points along a path providing a gradual change in at least one of said factors relative to the other of said factors from one point to the next along said path with said change producing a gradual variation in the thickness of the deposited coating along said path, whereby the transparent body will be provided with an optical density which gradually changes in degree.

2. In a method as recited in claim 1 and wherein point evaporators are used said points are arranged to provide a gradual change in the angle factor relative to the distance factor.

3. In a method as recited in claim 1 and wherein said evaporator is arranged in a horizontal straight line situated at a given elevation in a given vertical plane, said surface of said body being concave and extending only at one edge region through said plane while the remainder of said surface projects laterally from said plane on at least one side thereof, and said angle for determining said angle factor being measured from said one side of said plane.

4. In a method as recited in claim 3 and wherein the curvature of said surface in any plane perpendicular to said plane which contains said line provides distances and angle factors which gradually increase with increasing distance of points of said surface from said plane which contains said line, for determining the degree of gradual variation of optical density.

5. In a method as recited in claim 3 and wherein the curvature of said surface in any plane perpendicular to said plane which contains said line provides an angle factor which gradually increases and a distance factor which gradually decreases with increasing distance of points of said surface from said plane which contains said line, for determining the degree of gradual variation of optical density.

6. In a method as recited in claim 3 and wherein said surface forms part of a cylinder whose axis coincides with said line so that the variation in the degree of optical density is determined only by said angle factor.

7. In a method as recited in claim 3 and wherein at least part of said surface is substantially parallel to said plane which contains said line.

8. In a method as recited in claim 3 and wherein a row of evaporators for said light filtering substance is situated along said line with the successive evaporators being situated along said line close enough to each other to prevent any visually detectable variation in optical density in the direction of said line.

9. In a method as recited in claim 8 and wherein the distance between successive evaporators in said line does not exceed 0.3–0.4 times the distance of said surface from said line in said vertical plane which contains said line.

* * * * *